United States Patent
Anderson et al.

(10) Patent No.: US 8,975,531 B2
(45) Date of Patent: Mar. 10, 2015

(54) COMPOSITE COPPER WIRE INTERCONNECT STRUCTURES AND METHODS OF FORMING

(71) Applicant: International Business Machines Corporation, Armonk, NY (US)

(72) Inventors: Felix Anderson, Colchester, VT (US); Zhong-Xiang He, Essex Junction, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 216 days.

(21) Appl. No.: 13/746,627

(22) Filed: Jan. 22, 2013

(65) Prior Publication Data

US 2014/0202746 A1    Jul. 24, 2014

(51) Int. Cl.
| | | |
|---|---|---|
| *H05K 1/09* | (2006.01) | |
| *H05K 1/11* | (2006.01) | |
| *H05K 3/40* | (2006.01) | |

(52) U.S. Cl.
CPC ... *H05K 1/11* (2013.01); *H05K 3/40* (2013.01)
USPC ............ 174/257; 174/255; 174/261; 29/846

(58) Field of Classification Search
USPC .................... 174/255–261; 29/846
See application file for complete search history.

(56) References Cited

U.S. PATENT DOCUMENTS

| | | | |
|---|---|---|---|
| 5,278,448 | A | 1/1994 | Fujii |
| 5,808,856 | A * | 9/1998 | Bischoff et al. ............ 361/321.4 |
| 5,851,917 | A | 12/1998 | Lee |
| 6,235,406 | B1 | 5/2001 | Uzoh |
| 6,271,137 | B1 | 8/2001 | Liou et al. |
| 6,436,787 | B1 | 8/2002 | Shih et al. |
| 6,572,982 | B1 | 6/2003 | Uzoh et al. |
| 6,933,230 | B2 | 8/2005 | Dubin |
| 7,189,650 | B2 | 3/2007 | Liu et al. |
| 7,863,194 | B2 | 1/2011 | Yin et al. |
| 7,868,456 | B2 | 1/2011 | Suzuki et al. |
| 7,968,967 | B2 | 6/2011 | Wang et al. |
| 2003/0038369 | A1 | 2/2003 | Layadi et al. |
| 2004/0046261 | A1 | 3/2004 | Ohto et al. |
| 2004/0056366 | A1 | 3/2004 | Maiz et al. |
| 2006/0289999 | A1 | 12/2006 | Lee et al. |
| 2009/0203208 | A1 | 8/2009 | Ueki et al. |
| 2009/0227105 | A1 | 9/2009 | Fu et al. |

* cited by examiner

*Primary Examiner* — Jeremy C Norris
(74) *Attorney, Agent, or Firm* — David A. Cain; Hoffman Warnick LLC

(57) ABSTRACT

Various embodiments include interconnect structures and methods of forming such structures. The interconnect structures can include a composite copper wire which includes at least two distinct copper sections. The uppermost copper section can have a thickness of approximately 1 micrometer or less, which inhibits surface roughening in that uppermost section, and helps to enhance cap adhesion with overlying layers.

20 Claims, 8 Drawing Sheets

COMPOSITE COPPER WIRE INTERCONNECT STRUCTURES AND METHODS OF FORMING

FIELD

The subject matter disclosed herein relates to integrated circuits. More particularly, the subject matter relates to copper wire interconnect structures and methods of forming such structures.

BACKGROUND

Conventionally, thick damascene copper wires (e.g., 3 microns or thicker) exhibit significantly greater surface roughness, as well as grain morphology (e.g., grain growth) than thinner damascene copper wires (e.g., 1 micron or thinner). One reason for this difference is that the thicker copper wires are not constrained by the wire height.

Surface roughness in thick damascene copper wiring can contribute to diminished cap adhesion (e.g., of a silicon nitride, SiN cap) and other problems during subsequent thermal processing. This diminished cap adhesion can cause undesirable conditions such as delamination of the later-formed nitride/oxide film over the copper wiring, which may lead to via opens.

BRIEF DESCRIPTION

Various embodiments described include interconnect structures. In some cases, an interconnect structure is disclosed, including: a substrate having a recess with a bottom surface and sidewalls; a composite copper wire formed within the recess in the substrate, the composite copper wire including: a liner layer over the bottom surface and the sidewalls of the recess; a first copper layer over the liner layer, the first copper layer having a first thickness of approximately two micrometers or greater; a copper grain growth barrier layer over the first copper layer; and a second copper layer over the copper grain growth barrier layer, the second copper layer having a second thickness that is substantially less than the first thickness, the second thickness inhibiting surface roughness in the second copper layer.

A first aspect of the invention includes an interconnect structure including: a substrate having a recess with a bottom surface and sidewalls; a composite copper wire formed within the recess in the substrate, the composite copper wire including: a liner layer over the bottom surface and the sidewalls of the recess; a first copper layer over the liner layer, the first copper layer having a first thickness of approximately two micrometers or greater; a copper grain growth barrier layer over the first copper layer; and a second copper layer over the copper grain growth barrier layer, the second copper layer having a second thickness that is substantially less than the first thickness, the second thickness inhibiting surface roughness in the second copper layer.

A second aspect of the invention includes another interconnect structure. This structure can include: a substrate having a recess with a bottom surface and sidewalls; a liner layer over the bottom surface and the sidewalls of the recess; a first copper layer over a first portion of the liner layer, the first copper layer having a thickness of approximately two micrometers or greater; a copper grain growth barrier layer over the first copper layer and a second portion of the liner layer distinct from the first portion of the liner layer; and a second copper layer over the copper grain barrier layer, the second copper layer having a thickness of approximately one micrometer or less and a width that is less than a width of the first copper layer.

A third aspect of the invention includes a method of forming an interconnect structure. In some cases, the method can include: providing a substrate having a trench therein; forming a liner along the trench in the substrate; forming a first copper layer having a thickness of approximately 2 micrometers or greater over the liner within the trench; forming a copper grain growth barrier layer over the first copper layer; and forming a second copper layer having a thickness of approximately 1 micrometer or less over the copper grain growth barrier layer, wherein the thickness of the second copper layer inhibits surface roughness in the second copper layer.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
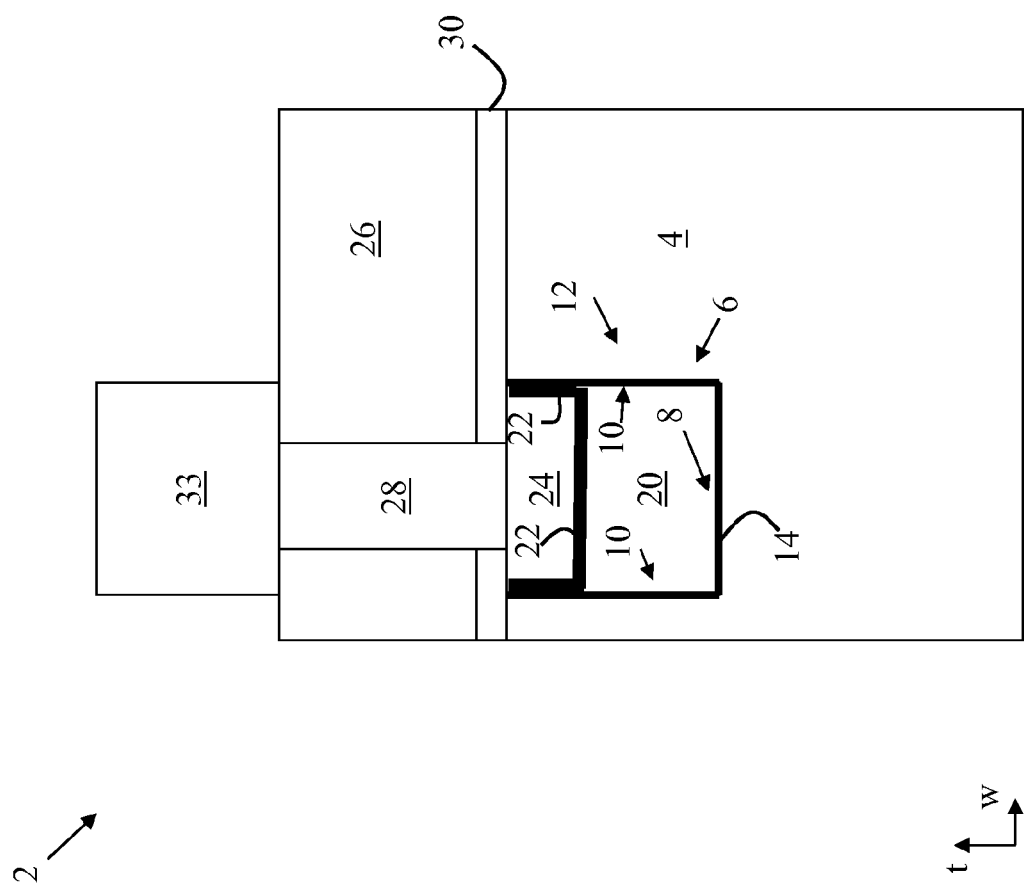
FIG. 1 shows a schematic cross-sectional view of an interconnect structure according to various embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As noted, the subject matter disclosed herein relates to integrated circuits. More particularly, the subject matter relates to copper wire structures and methods of forming such structures.

As described herein, surface roughness in thick damascene copper wiring can contribute to diminished cap adhesion (e.g., of a dielectric cap including one or more of silicon nitride, SiN, SiCN, SiCHN, CoWP, etc.) during subsequent thermal processing. This diminished cap adhesion can cause undesirable conditions such as delamination of the later-formed nitride/oxide film over the copper wiring, which may lead to via opens.

In contrast to the conventional interconnect structures which utilize thick damascene copper wiring, various embodiments of the invention include an interconnect structure having a composite wire within a substrate (e.g., a substrate including silicon dioxide, SiO2, or any known inter-metal dielectric including FSG and/or SiCOH). In some cases, the composite wire includes a first copper layer, and a second copper layer overlying the first copper layer. As described herein, the second copper layer has a thickness that is less than a thickness of the first copper layer. Simply put, the composite wire includes distinct layers of copper, where the copper layer near the surface is thinner than the underlying copper layer. The copper layers can be separated by a grain growth barrier (e.g., tantalum, Ta, or any liner metal such as TiN, TaN, Ru, etc.). In various particular cases described herein, the thinner copper layer is approximately 1 micrometer (um) or thinner so as to mitigate potential surface roughness in that copper layer. The thicker (underlying) copper layer can be approximately 2 or more micrometers thick.

In the interconnect structure, the thinner copper layer can contact an overlying via/viabar, which can include, e.g., tungsten (W), copper (Cu) or an aluminum-copper compound (Al—Cu). The via/viabar can act as an inter-level contact with an overlying wire (e.g., a Cu wire).

In various particular embodiments, an interconnect structure is disclosed. The interconnect structure can include: a substrate having a recess with a bottom surface and sidewalls; a composite copper wire formed within the recess in the substrate, the composite copper wire including: a liner layer over the bottom surface and the sidewalls of the recess; a first copper layer over the liner layer, the first copper layer having a first thickness of approximately two micrometers or greater; a copper grain growth barrier layer over the first copper layer; and a second copper layer over the copper grain growth barrier layer, the second copper layer having a second thickness that is substantially less than the first thickness, the second thickness inhibiting surface roughness in the second copper layer.

In various other particular embodiments, an alternative interconnect structure is disclosed. This interconnect structure can include: a substrate having a recess with a bottom surface and sidewalls; a liner layer over the bottom surface and the sidewalls of the recess; a first copper layer over a first portion of the liner layer, the first copper layer having a thickness of approximately two micrometers or greater; a copper grain growth barrier layer over the first copper layer and a second portion of the liner layer distinct from the first portion of the liner layer; and a second copper layer over the copper grain growth barrier layer, the second copper layer having a thickness of approximately one micrometer or less and a width that is less than a width of the first copper layer.

In yet other particular embodiments, a method of forming an interconnect structure is disclosed, the method including: providing a substrate having a trench therein; forming a liner along the trench in the substrate; forming a first copper layer having a thickness of approximately 2 micrometers or greater over the liner within the trench; forming a copper grain growth barrier layer over the first copper layer; and forming a second copper layer having a thickness of approximately 1 micrometer or less over the copper grain growth barrier layer, wherein the thickness of the second copper layer inhibits surface roughness in the second copper layer.

Turning to FIG. 1, a schematic cross-sectional view of an interconnect structure 2 is shown according to various embodiments of the invention. As shown, the interconnect structure 2 can include a substrate 4 having a recess 6 (now filled) with a bottom surface 8 and sidewalls 10. In some cases, the substrate 2 includes at least one of silicon (Si) or silicon dioxide (SiO2). Formed within the recess 6 in the substrate 4 is a composite copper wire 12, which can include several parts. The composite copper wire 12 can include a liner layer 14 over the bottom surface 8 and the sidewalls 10 of the recess 6. In some cases, the liner layer 14 is formed of conventional liner materials which substantially prevent diffusion of copper. Over the liner layer 14 is a first copper layer 20. The first copper layer 20 can be formed substantially of copper (Cu), and in various embodiments, has a thickness of approximately two (2) micrometers or greater. Due to its thickness, this first copper layer 20 can be referred to as a "thick" copper layer.

Overlying the first copper layer 20 is a copper grain growth barrier layer (or simply, "barrier layer") 22, which corrals the copper from the first copper layer 20 and prevents grain growth of that copper above the grain growth barrier layer 22. In various cases, the copper grain growth barrier layer 22 contacts the liner layer 14, e.g., proximate the sidewalls 10 of the recess 6.

Overlying the barrier layer 22 is a second copper layer 24 which has a second thickness that is substantially less (e.g., 40-50 percent less) than the thickness of the first copper layer 20. Due to its relative thinness, this second copper layer 24 can also be referred to herein as a "thin" copper layer. In various particular embodiments, the second copper layer 24 can have a thickness of approximately one (1) micrometer or less.

In any case, the second copper layer 24 can have a thickness which inhibits surface roughness (grain growth/shifting) in that second copper layer 24. That is, as described herein, the second copper layer 24 can be sized (in terms of thickness) to inhibit surface roughness, which can help to reduce issues related to surface adhesion in subsequent processing steps (as described further herein).

As shown, the interconnect structure 2 can further include an insulator layer 26 overlying the substrate 4 and the composite copper wire 12 (particularly, the second copper layer 24, barrier layer 22 and the liner 14. The insulator layer 26 can be formed of any conventional insulator material, e.g., Si, SiO2, etc.

The interconnect structure 2 can also include a via contact 28 extending through the insulator layer 26 and contacting the composite wire 12 (in particular, at the second copper layer 24). In some cases, the via contact 28 can include a conventional via contact metal such as tungsten (W), copper (Cu) and/or an aluminum-based compound (e.g., Al—Cu).

In some embodiments, the interconnect structure 2 can include a copper diffusion layer 30 which borders the substrate 4 and the second copper layer 24 (as well as the barrier layer 22 and the liner 14 in some cases). The copper diffusion layer 30 separates the insulator layer 26 and the substrate 4, and helps to prevent diffusion of copper from the second copper layer 24. The copper diffusion layer 30 can include an adhesive insulator material including at least one of silicon nitride (SiN), a metal, or cobalt tungsten phosphide (CoWP), and may be formed using a plasma pretreatment step using, for example NH$_3$, to clean the copper surface (e.g., of second copper layer 24) and provide good adhesion of the copper diffusion layer 30 to the copper surface (e.g., second copper layer 24).

Also shown, in some embodiments the interconnect structure 2 can include a wire 33 (e.g., including an aluminum-based compound such as Al—Cu) overlying the insulator 26. In some cases, the via contact 28 extends from the wire 32 to the composite wire 12 (to contact the second copper layer 24) within the substrate 4.

In some embodiments described herein, the first copper layer 22 and the second copper layer 24 have distinct widths (along the "w" direction), as well as having distinct thicknesses (along the "t" direction). These scenarios are further described herein, however, it is understood that regardless of a difference in width between the first copper layer 22 and the second copper layer 24, the second copper layer 24 is always thin enough to inhibit the formation of surface roughness in that layer (so as to avoid negatively affecting adhesion of overlying layers/components such as the barrier layer 22, insulator 26, and/or via contact 28.

Figure 2:
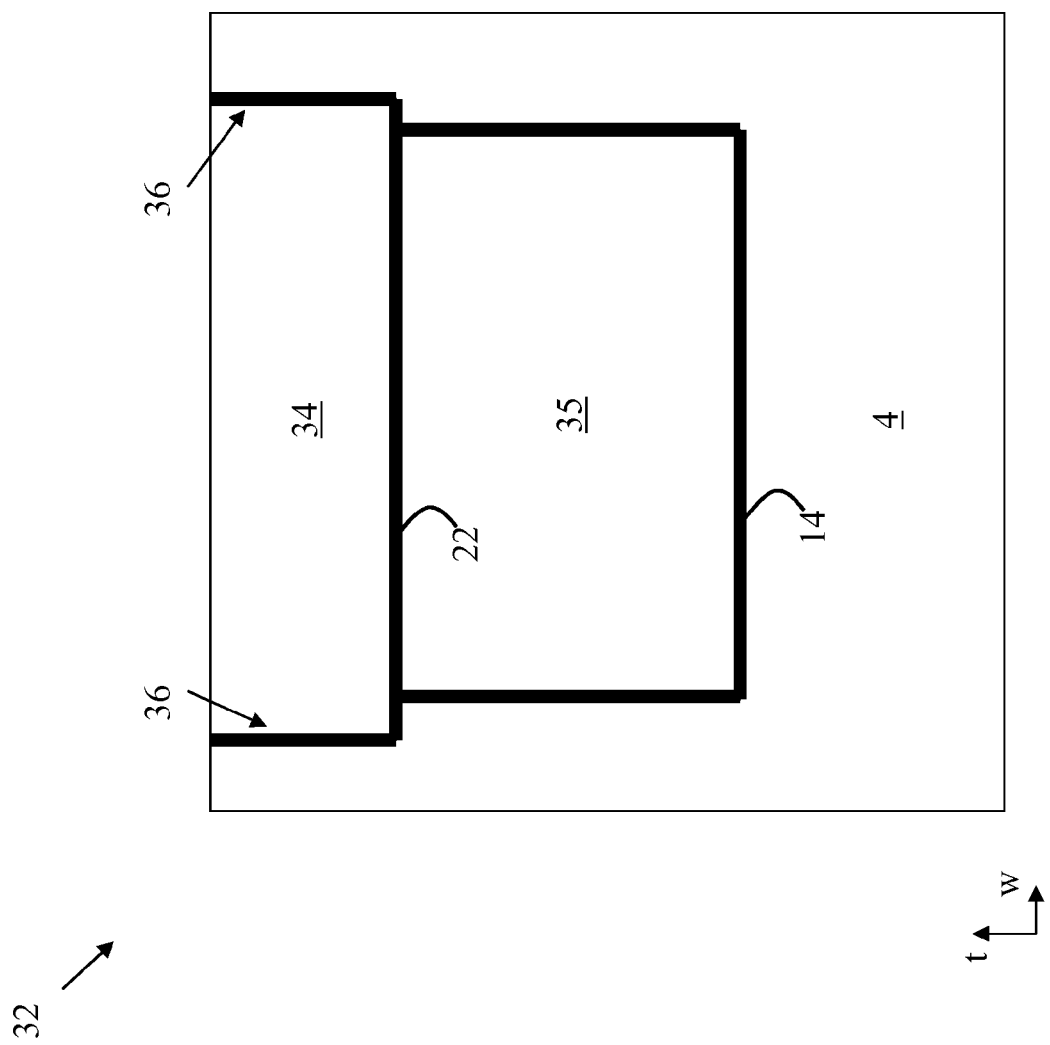
FIG. 2 shows a schematic cross-sectional view of a composite copper wire structure compatible with the interconnect structure of FIG. 1, according to various alternative embodiments.
Figure 3:
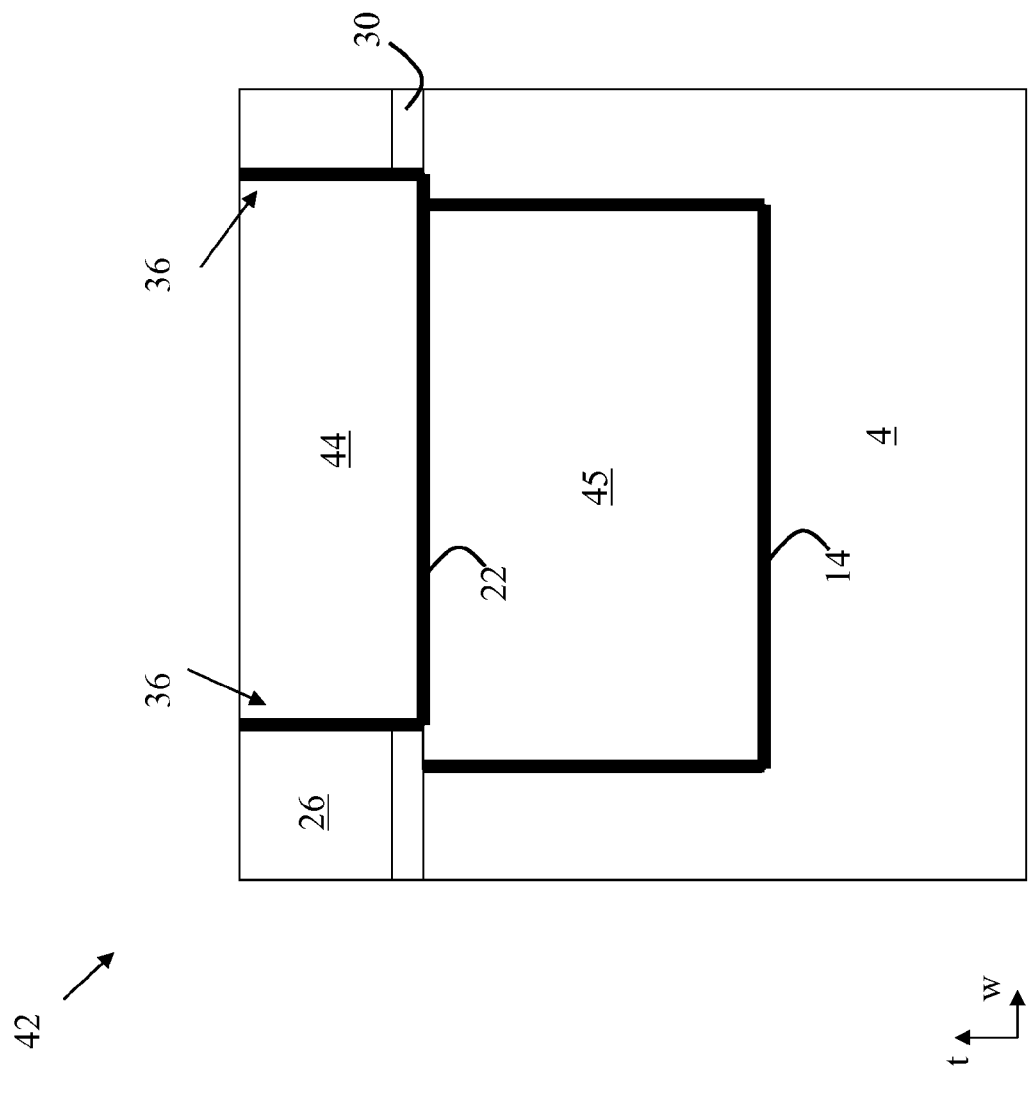
FIG. 3 shows a schematic cross-sectional view of a composite copper wire structure compatible with the interconnect structure of FIG. 1, according to various alternative embodiments.

FIGS. 2 and 3, respectively, show cross-sectional schematic views of alternative composite copper wires according to various embodiments. FIG. 2 and FIG. 3 each show a portion of an interconnect structure (e.g., similar to interconnect structure 2 of FIG. 1), where the composite copper wire 12 is replaced with an alternative composite copper wire 32, 42, respectively. In FIG. 2, the composite copper wire 32 can include a second copper layer 34 which has a greater width (w) than an underlying first copper layer 35. In this case, sidewall portions 36 of the barrier layer 22 are in contact with the substrate 4 in a region of the substrate 4 over the liner layer 14. That is, these sidewall portions 36 do not contact the liner layer 14. In FIG. 3, another composite copper wire 42 is shown including a copper diffusion layer 30 which separates the insulator layer 26 and the substrate 4. In this case, the second copper layer 44 and the first copper layer 45 may have a substantially similar width (w), but may be off-set such that the second copper layer 44 does not align vertically with the first copper layer 45.

Figure 4:
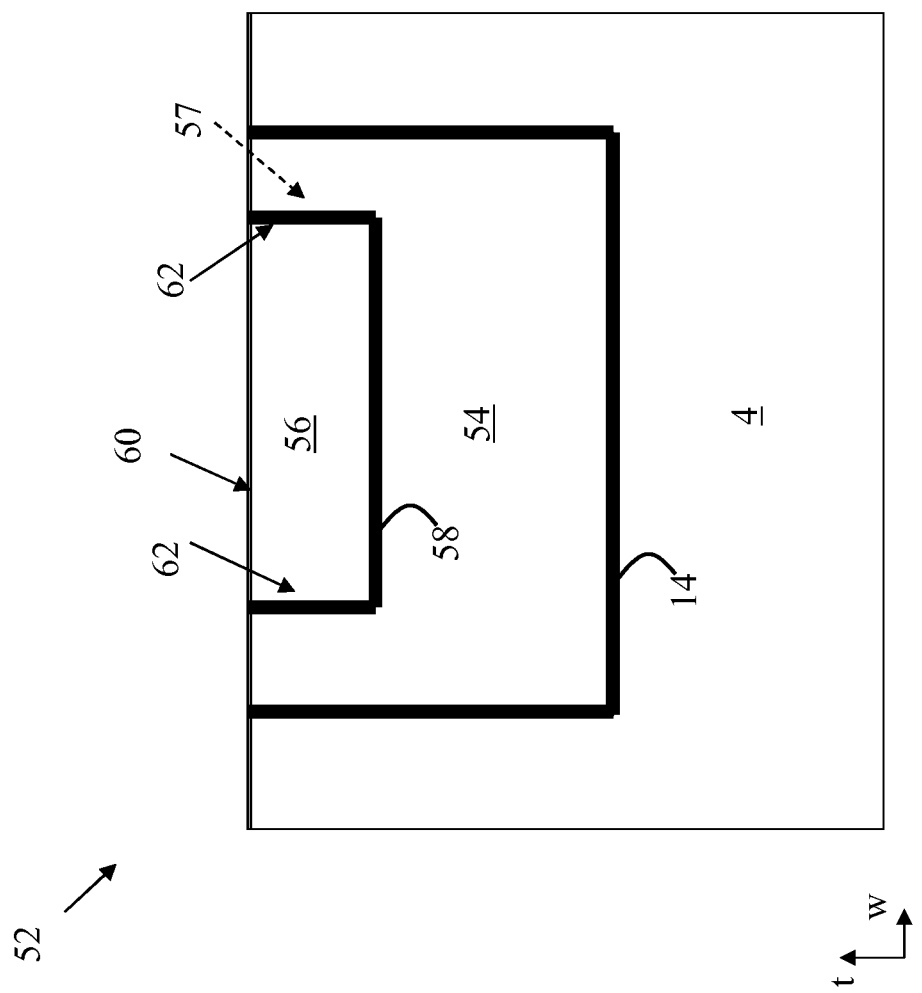
FIG. 4 shows a schematic cross-sectional view of a composite copper wire structure compatible with the interconnect structure of FIG. 1, according to various alternative embodiments.

FIG. 4 shows an alternative embodiment of a composite copper wire 52, which includes a first copper layer 54 which substantially surrounds a second copper layer 56 (as well as a barrier layer 58 separating the first copper layer 54 and the second copper layer 56). In this embodiment, the first copper layer 54 has a greater width (w) than the second copper layer 56). As shown, the first copper layer 54 substantially surrounds the second copper layer 56 (as well as the barrier layer 58), except on an upper surface 60 of the second copper layer 56. The second copper layer 56 is formed within a recess 57 in the first copper layer 54 in some cases. As is also illustrated in this embodiment, the barrier layer 58 can extend along sidewalls 62 of the first copper layer 54 within the recess 57.

Figure 7A:
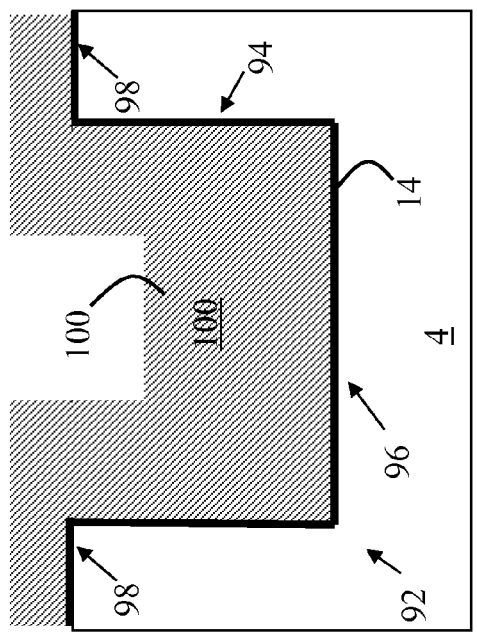
FIGS. 7A-7D show schematic cross-sectional views of a process of forming the composite copper wire in the interconnect structure of FIG. 1.
Figure 7B:
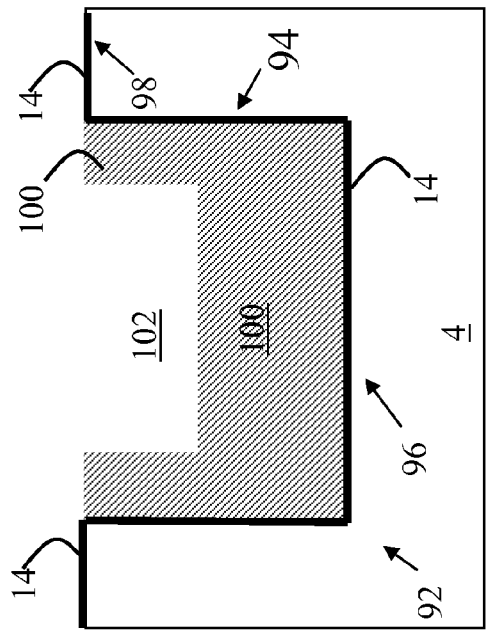
Figure 7C:
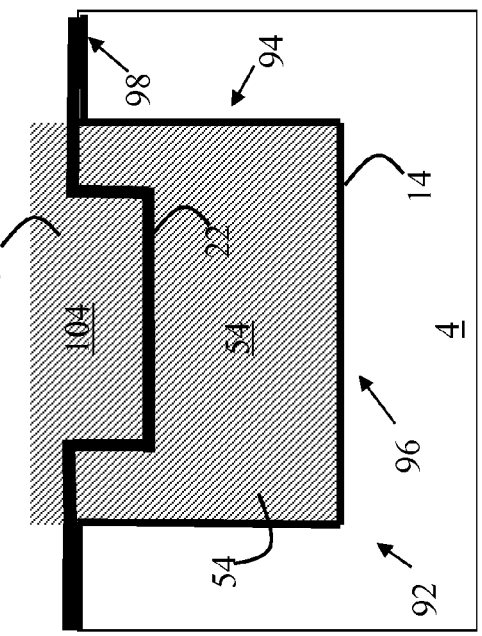

FIGS. 5A-5D illustrate processes in a method of forming the interconnect structure 2 of FIG. 1 according to various embodiments of the invention. As shown, the method can include providing a substrate 4 having a trench 80 therein (FIG. 7A). Also shown in FIG. 7A, the process can include forming a liner (e.g., via conventional deposition techniques) 14 along the trench 80 in the substrate 4, and forming a copper layer 82 (e.g., via conventional deposition techniques) over the liner 14 within the trench 80. FIG. 7B illustrates etching the copper layer 82 to form a first copper layer 20 having a thickness of approximately 2 micrometers (or greater) over the liner 14 within the trench 80. The copper layer 82 could be etched using any known method, such as RIE or wet etch such as dilute ferric chloride, as known in the art. FIG. 7C illustrates forming a copper grain growth barrier layer (or, barrier layer) 22 over the first copper layer 20, and forming an additional copper layer 84 over the barrier layer 22. In some cases, the barrier layer 22 can be formed over the liner 14 within the trench 80, and in some cases, can also be formed over the liner 14 outside of the trench 80 (overlying the substrate 4 outside of the trench 80). In various cases, the barrier layer 22 can be deposited via a conventional physical vapor deposition (PVD) technique as known in the art to adhere to the liner layer 22. As shown, the barrier layer 22 can also be deposited over the underlying first copper layer 20. The additional copper layer 84 can be deposited over the entirety of the barrier layer 22, e.g., via electroless copper plating or electro copper plating with or without a PVD copper seed layer deposited first.

Figure 7D:
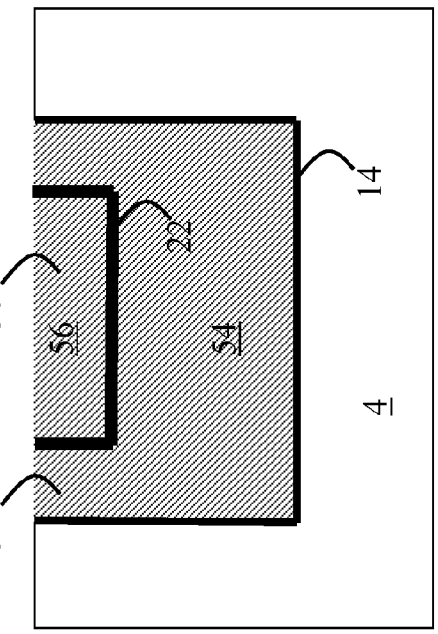

FIG. 7D illustrates another process which can include planarizing (e.g., chemical-mechanical planarizing/polishing) the additional copper layer 84 (and in some cases, the barrier layer 22 and liner layer 14 outside of the trench 80) to form second copper layer 24. The second copper layer 24 (as similarly described herein), has a thickness of approximately 1 micrometer or less; a thickness which inhibits surface roughness in that second copper layer 24. FIG. 7D illustrates features of the composite copper wire 12 shown and described with reference to FIG. 1.

Figure 5A:
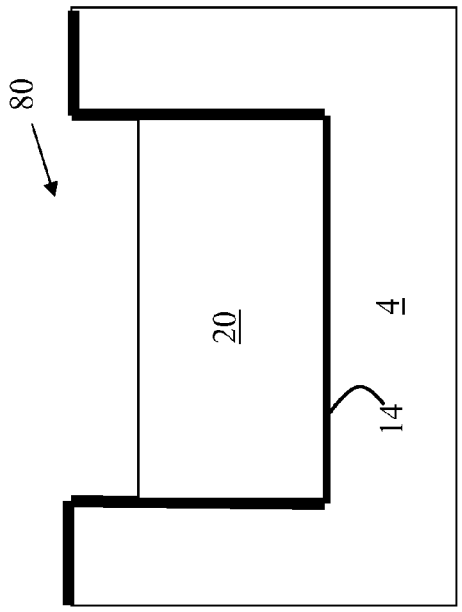
FIGS. 5A-5D illustrate processes in a method of forming an interconnect structure according to various alternative embodiments.
Figure 5B:
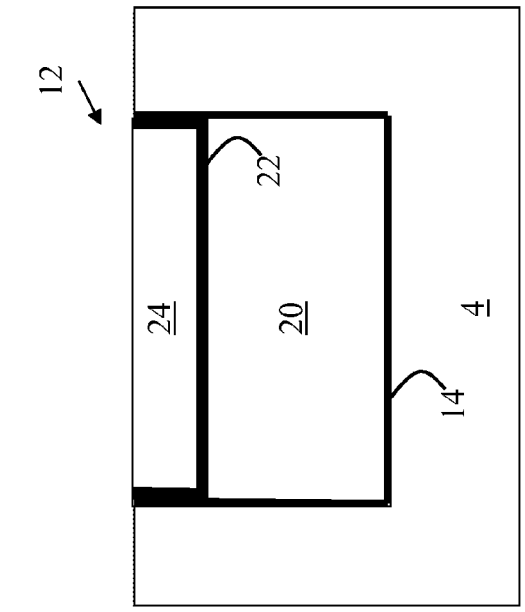
Figure 5C:
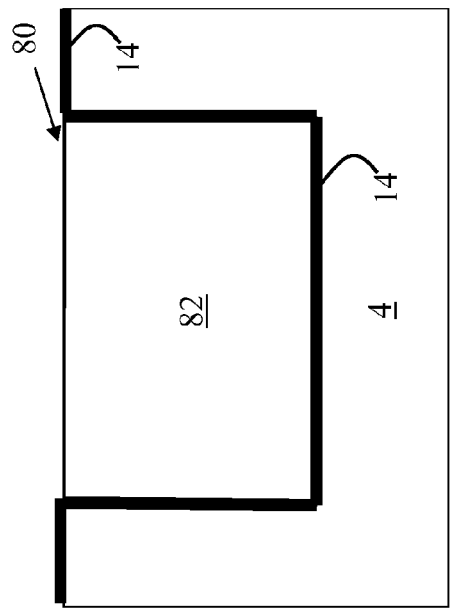
Figure 5D:
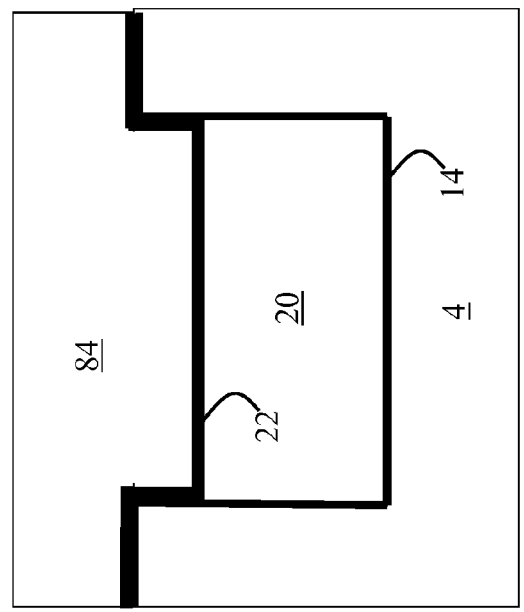
Figure 5C:
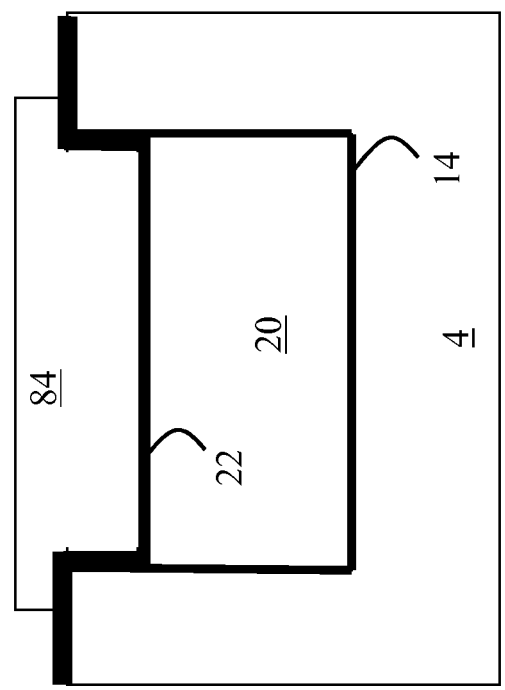

FIG. 5C' shows an alternative process step in the process illustrated in FIGS. 5A-5D, where FIG. 5C' can replace FIG. 5C in the illustrated flow. That is, following etching to form the first copper layer 20, as shown in FIG. 5C', the barrier layer 22 and additional copper layer 84 can be formed over the first copper layer 20 and the liner 14 as described with reference to FIG. 5C. However, in this embodiment, the additional copper layer 84 is planarized in a separate processing step (shown in FIG. 5C') prior to planarizing the barrier layer 22 and the underlying liner 14. Following this separate planarizing process, the remaining portion of the additional copper layer 84 can be planarized along with the barrier layer 22 and the liner layer 14 overlying the substrate 4 outside of the trench 80. These planarization processes can result in formation of the composite copper wire 12 shown and described with reference to FIG. 1.

Figures 6A, 6B:
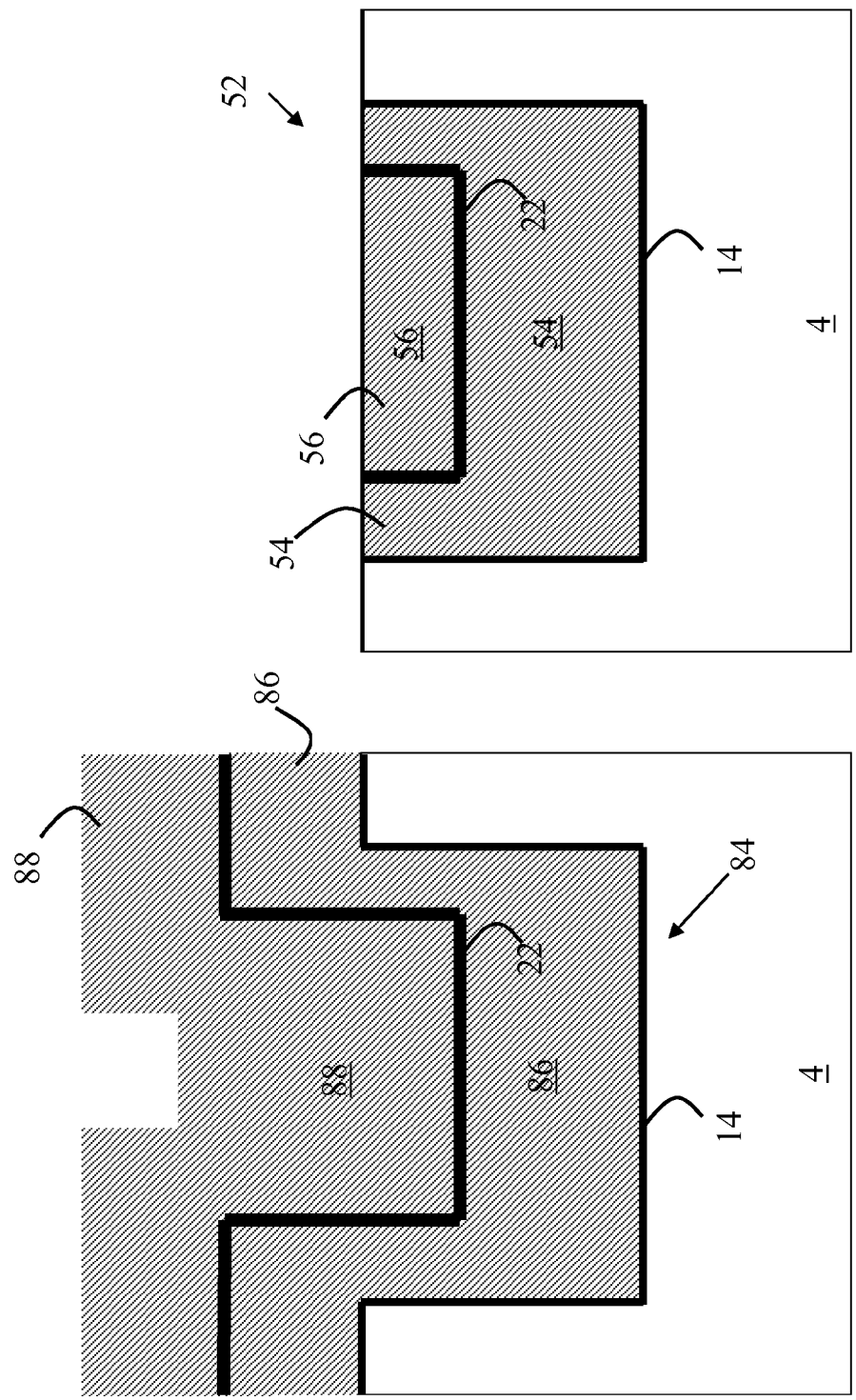
FIGS. 6A and 6B illustrate alternative processes in forming a composite copper wire according to various alternative embodiments.

FIGS. 6A and 6B illustrate alternative processes in forming a composite copper wire, e.g., the composite copper wire 52 of FIG. 4. In this case, a portion of the process illustrated in FIG. 6A can include forming a liner 14 within a trench 84 in a substrate 4 (as well as along upper surfaces of the substrate 4 outside of the trench 84). The process can also include forming a first precursor copper layer 86 over the liner 14 (e.g., along a substantial entirety of the liner 14). Additionally, the process can include forming a barrier layer 22 overlying the first precursor copper layer 86, as well as forming a second precursor copper layer 88 over the barrier layer 22. Forming of these various layers can be performed by any conventional deposition techniques known in the art or described herein. FIG. 6B illustrates an additional process of planarizing (e.g., using chemical-mechanical planarization/polishing) to form the composite copper wire 52 shown and described with reference to FIG. 4. Description of that composite copper wire 52 is included with the description of FIG. 4, and as such, is omitted with respect to FIG. 9B.

FIGS. 7A-7D illustrate another process in forming a composite copper wire, e.g., the composite copper wire 52 of FIG. 4. This process can include using an electroplating process (e.g., electrolessly plating) to form the first precursor copper layer. FIG. 7A illustrates a first process of providing a precursor structure having a substrate 4 with a trench 92, a liner 14 within the trench 92 (e.g., along sidewalls 94 and a bottom 96 of the trench 92) and over upper surfaces 98 of the substrate 4, and a first precursor copper layer 100 overlying the liner 14. The first precursor copper layer 100 can have a thickness of less than the depth of the trench 92 (as measured from the upper surface 98 of the substrate 4). The first precursor copper layer 100 is thinner along sections which overly the upper surface 98 of the substrate 4. As noted herein, this non-uniform thickness of the first precursor copper layer 100 can be attributed to its deposition using an electroplating technique (e.g., electrolessly plating the first precursor copper layer 100). It is understood that a thin PVD Cu layer can be deposited prior to the thicker first precursor (electroplated) copper layer 100, as known in the art.

FIG. 7B illustrates the precursor structure of FIG. 7A after planarizing of the first precursor copper layer 100 (e.g., chemical mechanical planarizing/polishing) of the first precursor copper layer 100 to expose the liner 14 overlying the upper surfaces 98 of the substrate 4. As shown, the first precursor copper layer 100 has a recess 102 therein, formed as a result of the electroplating process.

FIG. 7C shows the process of forming a barrier layer 22 over the first precursor copper layer 102 and the liner 14 (e.g., above the liner 14 which overlies the upper surface 98 of the substrate 4), as well as the forming of a second precursor copper layer 104 over the barrier layer 22. The second precursor copper layer 104 can be selectively plated over the barrier layer 22, only where that barrier layer 22 overlies the copper layer 54 (not above the portion of the barrier layer 22 overlying the upper surface 98 of the substrate 4).

FIG. 7D illustrates an additional process of planarizing (e.g., using chemical-mechanical planarization/polishing) to form the composite copper wire 52 shown and described with reference to FIG. 4. Description of that composite copper wire 52 is included with the description of FIG. 4, and as such, is omitted with respect to FIG. 7D.

As described herein, various particular embodiments of the invention a method of forming an interconnect structure, e.g., interconnect structure 2 (FIG. 1) and/or a composite copper wire for implementation in an interconnect structure such as the interconnect structure 2 of FIG. 1. In some cases, at least a portion of the method(s) could be used to form the composite copper wires shown in any embodiments herein, e.g., composite copper wire 12, composite copper wire 32, composite copper wire 42, composite copper wire 52, composite copper wire 72 and/or composite copper wire 74. In some cases, the process can include:

Process P1: providing a substrate having a trench therein;

Process P2: forming a liner along the trench in the substrate;

Process P3: forming a first copper layer having a thickness of approximately 2 micrometers or greater over the liner within the trench. In some cases, this can include electroplating the first copper layer, leaving a recess in the first copper layer;

Process P4: forming a copper grain growth barrier layer over the first copper layer. In some cases, this can include lining the recess with the copper grain growth barrier layer to fill only a portion of the recess in the first copper layer; and Process P5: forming a second copper layer having a thickness of approximately 1 micrometer or less over the copper grain growth barrier layer, wherein the thickness of the second copper layer inhibits surface roughness in the second copper layer. In some cases, this can include filling a remainder of the recess not filled by the copper grain growth barrier layer.

As described herein, various alternative embodiments of the invention include a method of forming an interconnect structure, e.g., interconnect structure 2 (FIG. 1) and/or a composite copper wire for implementation in an interconnect structure such as the interconnect structure 2 of FIG. 1. In some cases, at least a portion of the alternative method(s) could be used to form the composite copper wires shown in any embodiments herein, e.g., composite copper wire 12, composite copper wire 32, composite copper wire 42, composite copper wire 52, composite copper wire 72 and/or composite copper wire 74. In some cases, the alternative process can include:

Process P11: providing a substrate having a trench therein;

Process P12: forming a liner along the trench in the substrate. In some cases, the forming of the liner further includes forming the liner over an upper surface of the substrate;

Process P13: forming a first copper layer having a thickness of approximately 2 micrometers or greater over the liner within the trench. In some cases, the forming of the first copper layer includes depositing the first copper layer to substantially fill the trench;

Process P14: etching the first copper layer to a level below a top of the trench;

Process P15: forming a copper grain growth barrier layer over the first copper layer. In some cases, the forming of the copper grain growth barrier layer further includes forming the copper grain growth barrier directly over a portion of the liner over the upper surface of the substrate; and Process P16: forming a second copper layer having a thickness of approximately 1 micrometer or less over the copper grain growth barrier layer, wherein the thickness of the second copper layer inhibits surface roughness in the second copper layer.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claim

We claim:

1. An interconnect structure comprising:
    a substrate having a recess with a bottom surface and sidewalls;
    a composite copper wire formed within the recess in the substrate, the composite copper wire including:
        a liner layer over the bottom surface and the sidewalls of the recess;
        a first copper layer over the liner layer, the first copper layer having a first thickness of approximately two micrometers or greater;
        a copper grain growth barrier layer over the first copper layer; and
        a second copper layer over the copper grain growth barrier layer, the second copper layer having a second thickness that is substantially less than the first thickness, the second thickness inhibiting surface roughness in the second copper layer.

2. The interconnect structure of claim 1, wherein the second thickness is equal to approximately one (1) micrometer or less.

3. The interconnect structure of claim 1, further comprising:
   a copper diffusion layer over the composite copper wire;
   an insulator layer overlying the copper diffusion layer; and
   a via contact extending through the insulator layer and contacting the composite wire.

4. The interconnect structure of claim 3, wherein the via contact contacts the composite wire at the second copper layer.

5. The interconnect structure of claim 3, wherein the copper diffusion layer includes at least one of silicon nitride (SiN), a metal or cobalt tungsten phosphide (CoWP).

6. The interconnect structure of claim 3, further comprising a border layer separating the insulator layer and the substrate.

7. The interconnect structure of claim 3, further comprising a wire overlying the insulator, wherein the via contact extends from the wire to the composite wire within the substrate.

8. The interconnect structure of claim 1, wherein the second copper layer has a substantially equal width as a width of the first copper layer.

9. The interconnect structure of claim 8, wherein the second copper layer is off-set relative to the first copper layer.

10. The interconnect structure of claim 1, wherein the second copper layer has a lesser width than a width of the first copper layer, and the first copper layer substantially surrounds the second copper layer except on an upper surface of the second copper layer.

11. The interconnect structure of claim 1, wherein the copper grain growth barrier layer lines an upper surface of the first copper layer within the recess.

12. The interconnect structure of claim 11, wherein the copper grain growth barrier layer contacts the liner layer along sidewalls of the recess.

13. An interconnect structure comprising:
   a substrate having a recess with a bottom surface and sidewalls;
   a liner layer over the bottom surface and the sidewalls of the recess;
   a first copper layer over a first portion of the liner layer, the first copper layer having a thickness of approximately two micrometers or greater;
   a copper grain growth barrier layer over the first copper layer and a second portion of the liner layer distinct from the first portion of the liner layer; and
   a second copper layer over the copper grain growth barrier layer, the second copper layer having a thickness of approximately one micrometer or less and a width that is less than a width of the first copper layer.

14. The interconnect structure of claim 13, wherein the thickness of the second copper layer inhibits surface roughness in the second copper layer.

15. The interconnect structure of claim 13, further comprising:
   a copper diffusion layer over the second copper layer;
   an insulator layer overlying the copper diffusion layer; and
   a via contact extending through the insulator layer and contacting the second copper layer.

16. The interconnect structure of claim 15, further comprising a wire overlying the insulator, wherein the via contact extends from the wire to the second copper layer within the substrate.

17. The interconnect structure of claim 13, wherein the copper grain growth barrier layer substantially surrounds the second copper layer.

18. A method comprising:
   providing a substrate having a trench therein;
   forming a liner along the trench in the substrate;
   forming a first copper layer having a thickness of approximately 2 micrometers or greater over the liner within the trench;
   forming a copper grain growth barrier layer over the first copper layer; and
   forming a second copper layer having a thickness of approximately 1 micrometer or less over the copper grain growth barrier layer, wherein the thickness of the second copper layer inhibits surface roughness in the second copper layer.

19. The method of claim 18, wherein the forming of the first copper layer includes electroplating the first copper layer, leaving a recess in the first copper layer,
   wherein the forming of the copper grain growth barrier layer includes lining the recess with the copper grain growth barrier layer to fill only a portion of the recess in the first copper layer, and
   wherein the forming of the second copper layer includes filling a remainder of the recess not filled by the copper grain growth barrier layer.

20. The method of claim 18, wherein the forming of the liner further includes forming the liner over an upper surface of the substrate,
   wherein the forming of the first copper layer includes depositing the first copper layer to substantially fill the trench,
   wherein the method further comprises etching the first copper layer to a level below a top of the trench, and
   wherein the forming of the copper grain growth barrier layer further includes forming the copper grain growth barrier directly over a portion of the liner over the upper surface of the substrate.

* * * * *